(12) United States Patent
Kikuchi

(10) Patent No.: US 9,281,447 B2
(45) Date of Patent: Mar. 8, 2016

(54) METHOD FOR SYNTHESIZING INDIUM PHOSPHIDE NANOPARTICLES

(71) Applicant: FUJIFILM Corporation, Tokyo (JP)

(72) Inventor: Makoto Kikuchi, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 153 days.

(21) Appl. No.: 14/092,715

(22) Filed: Nov. 27, 2013

(65) Prior Publication Data

US 2014/0084212 A1     Mar. 27, 2014

Related U.S. Application Data

(63) Continuation of application No. PCT/JP2012/062019, filed on May 10, 2012.

(30) Foreign Application Priority Data

May 30, 2011 (JP) ................................ 2011-120258
Feb. 17, 2012 (JP) ................................ 2012-032507

(51) Int. Cl.
| | | |
|---|---|---|
| C09K 11/70 | (2006.01) |
| C09K 11/62 | (2006.01) |
| H01L 33/30 | (2010.01) |
| B82Y 40/00 | (2011.01) |
| C01B 25/08 | (2006.01) |
| B82Y 30/00 | (2011.01) |
| C09K 11/02 | (2006.01) |
| C09K 11/56 | (2006.01) |

(52) U.S. Cl.
CPC ............... *H01L 33/30* (2013.01); *B82Y 30/00* (2013.01); *B82Y 40/00* (2013.01); *C01B 25/082* (2013.01); *C09K 11/02* (2013.01); *C09K 11/565* (2013.01); *C09K 11/70* (2013.01)

(58) Field of Classification Search
CPC .............................. B82Y 40/00; C01B 25/082
See application file for complete search history.

(56) References Cited

U.S. PATENT DOCUMENTS

| | | |
|---|---|---|
| 2008/0199381 A1 | 8/2008 | Tokumitsu |
| 2008/0268248 A1 | 10/2008 | Jang et al. |
| 2009/0315446 A1 | 12/2009 | Murase et al. |
| 2013/0092883 A1* | 4/2013 | Kahen et al. ................ 252/512 |

FOREIGN PATENT DOCUMENTS

| | | |
|---|---|---|
| EP | 1985583 | * 10/2008 |
| JP | 2006-265022 A | 10/2006 |
| JP | 2008-44827 A | 2/2008 |
| JP | 2008-279591 A | 11/2008 |
| JP | 2009-19067 A | 1/2009 |
| JP | 2009-40633 A | 2/2009 |
| JP | 2010-106119 A | 5/2010 |
| JP | 2010-138367 A | 6/2010 |
| WO | WO 2007/138851 A1 | 6/2007 |

OTHER PUBLICATIONS

International Preliminary Report on Patentability and an English translation of the Written Opinion of the International Searching Authority (Forms PCT/IB/338, PCT/IB/373, PCT/ISA/237) for International Application No. PCT/JP2012/062019, dated Dec. 12, 2013.
International Search Report Issued in PCT/JP2012/062019, mailed on Aug. 21, 2012.

* cited by examiner

*Primary Examiner* — Carol M Koslow
(74) *Attorney, Agent, or Firm* — Birch, Stewart, Kolasch & Birch, LLP

(57) ABSTRACT

The method for synthesizing indium phosphide nanoparticles using indium trichloride as an indium raw material and tris (dimethylamino)phosphine as a phosphorus raw material, includes a preparation step of mixing the indium raw material, the phosphorus raw material, an organic solvent having a boiling point of 170° C. or higher, and a particle surface ligand to obtain a mixture solution and a synthesis step of synthesizing the indium phosphide nanoparticles by heating the mixture solution to 150° C. or higher but lower than 170° C. In the method, the particle surface ligand is an aliphatic amine having a carbon number of 18 or more, and the indium trichloride is an anhydride.

6 Claims, No Drawings

METHOD FOR SYNTHESIZING INDIUM PHOSPHIDE NANOPARTICLES

CROSS-REFERENCE TO RELATED APPLICATIONS

This application is a continuation of PCT International Application No. PCT/JP2012/062019 filed on May 10, 2012, which claims priority under 35 U.S.C 119(a) to Application Nos. 2011-120258 filed on May 30, 2011 and 2012-032507 filed on. Feb. 17, 2012 in Japan, all of which are hereby expressly incorporated by reference into the present application.

BACKGROUND OF THE INVENTION

The present invention relates to a method for synthesizing indium phosphide (hereinafter abbreviated as "InP") nanoparticles and the nanoparticles produced by the synthesis method. In particular, the present invention relates to a method for synthesizing InP nanoparticles which exhibit both excellent solution dispersibility and high photoluminescence (PL) intensity, and the nanoparticles produced by the synthesis method.

At present, various studies have been made on nano-order semiconductor fine particles. Such nano-order semiconductor fine particles are used in light-emitting diodes (LEDs), electroluminescence devices, photoelectric conversion devices, and the like.

II-VI compound semiconductors such as CdSe and CdS, and III-V compound semiconductors such as InP are used for the nano-order semiconductor fine particles.

One of the methods for synthesizing InP nanoparticles is the so-called solvothermal method, in which raw materials and an organic solvent are placed and sealed in a reaction container in an inert atmosphere, and heated by a heater to cause reaction under high temperature and high pressure. Another method for synthesizing InP nanoparticles is the so-called hot-soap method, in which a flask is heated in an oil-bath or the like while being supplied with an inert gas, and raw materials are introduced into a hot reaction solution through a syringe to cause reaction.

JP 2006-265022 A, JP 2008-44827 A, WO 07/138,851, JP 2009-19067 A, JP 2009-40633 A, JP 2008-279591 A, JP 2010-106119 A, and JP 2010-138367 A describe methods for synthesizing or producing InP nanoparticles according to the solvothermal method and the hot-soap method.

JP 2006-265022 A describes the following method for synthesizing InP fine particles.

First, 17.6 mg (60 μmol) of indium isopropoxide (In (OiPr)$_3$) and 13.3 mg (60 μmol) of anhydrous indium chloride (InCl$_3$) as indium (In) raw materials are mixed and dissolved in 2 g of trioctylphosphine which is a Lewis-base solvent. Then, 26.3 μl (90 μmol) of tris(trimethylsilyl)phosphine (P(TMS)$_3$) as a phosphorus (P) raw material is added to this solution, and the solution is heated to 300° C. At this time, a change in color of the solution from yellow to dark brown is observed. By heating for 10 minutes, InP fine particles are synthesized. Thereafter, the reaction solution is allowed to spontaneously cool to room temperature, resulting in a dispersion of the InP fine particles dispersed in the TOP solvent.

JP 2008-44827 A describes the following method for producing InP nanoparticles.

First, trioctylphosphine oxide (TOPO) and trioctylphosphine (TOP) that are coordinating organic solvents are mixed at a TOPO:TOP weight ratio of 1:9, and 10 mL of the mixture is taken into a three-necked flask. 0.6 g of indium chloride as an In raw material is introduced into the flask, and the mixture is stirred overnight at room temperature, to obtain a transparent solution (Step S1).

The transparent solution is heated to 175° C., 0.5 mg of tris(trimethylsilyl)phosphine as a P raw material is added to the heated transparent solution through a syringe, and the solution is held for 7 minutes as is. InP nanoparticles are thereby synthesized. After the solution is held for 7 minutes, the heat source is removed from the three-necked flask (Step S2).

The above-described steps are all operated under an inert atmosphere with argon.

Then, the synthesized InP nanoparticles are flocculated with methanol, subjected to centrifugal separation, followed by decantation (Step S3), and dispersed in hexane, to thereby remove impurities contained in the solution (Step S4). After these steps are repeated three times, a rotary evaporator is used to remove the hexane from the InP nanoparticles (Step 5).

In 10 mL of the reaction solution in which TOPO and TOP are mixed at a TOPO:TOP weight ratio of 1:9, the washed InP nanoparticles are dispersed (Step S6). The reaction solution in which the InP nanoparticles are dispersed is put into a three-necked flask and heated to 175° C. Then, after 60 minutes elapsed, the heat source is removed from the three-necked flask to terminate heating (Step 7).

WO 07/138,851 describes III-V semiconductor/SiO$_2$ nanoparticles having a core made of a III-V semiconductor and a shell made of SiO$_2$ in which a particle size of the core is in a range of 1 nm to 50 nm.

WO 07/138,851 describes the following method for producing the III-V semiconductor/SiO$_2$ nanoparticles.

First, 0.5 g of trioctylphosphine oxide (TOPO) and 4.5 g of trioctylphosphine (TOP) are put in a three-necked flask and heated to 290° C. Rapidly poured therein is a mixture of 0.8 g of InCl$_3$, 0.75 g of trismethylsilyl phosphine ((CH$_3$)$_3$Si)$_3$P), 0.5 g of TOPO and 4.5 g of TOP. Then, the mixture is held at 270° C. for one day, and thereafter cooled to room temperature. In this state, dehydrated methanol is added dropwise to cause flocculation and precipitation, supernatant liquid is removed by centrifugal separation, and nanoparticles are obtained. At this time, an amount of dehydrated methanol is controlled, and the steps of dropwise addition of methanol, precipitation, and centrifugal separation are repeated, thereby obtaining precipitated flocculates of nanoparticles, which are further washed with pyridine to remove the TOP and TOPO from their surfaces. As a result, flocculates of InP nanoparticles with a particle size of 5.1 nm are obtained.

Thereafter, 3.7×10$^{-3}$ g of tetraethoxysilane, 50 mL of 0.5 mol/L HCl, 50 mL of ethanol and 10$^{-6}$ mol of the InP nanoparticle flocculates are put into a beaker, heated to 80° C. and stirred for an hour. As a result, a 10$^{-5}$ M nanoparticle dispersion in which the InP particles have a particle size of 5.1 nm and their particle surfaces have been provided with SiO$_2$ shells with a thickness of 1.2 nm is obtained.

JP 2009-19067 A describes a method for synthesizing semiconductor fine particles comprising InP.

In the method for synthesizing semiconductor fine particles comprising InP of JP 2009-19067 A, first, 200 mL of trioctylphosphine as an organic compound and 17.3 g of trioctylphosphine oxide as an organic compound are weighed in a glovebox at a dry nitrogen atmosphere. The trioctylphosphine and the trioctylphosphine oxide are then mixed and stirred for 10 minutes. The resultant stirred solution is referred to as "mixture solvent A." Then, 9.9 g of indium trichloride as a group III metal element material and 7.3 g of tris(dimethylamino)phosphine as a group V element material of semiconductor fine particles are weighed in the glovebox, and the indium trichloride and the tris(dimethylamino)phosphine are mixed into the mixture solvent A. After mixing them, the mixture solvent A containing the indium trichloride and the tris(dimethylamino)phosphine is stirred for 10 minutes while being heated at 20° C. The stirred mixture solvent A is referred to as "raw material solution B."

Next, the raw material solution B is placed in a reaction tank of an autoclave apparatus for supercritical synthesis in a vacuum atmosphere, heated to 350° C. over an hour with stirring, and then maintained at 350° C. for six hours to undergo a synthesis reaction. The raw material solution B which has undergone the synthesis reaction is referred to as "synthesis solution C." Following the reaction step, the synthesis solution C is allowed to cool naturally to room temperature and thereafter recovered in a dry nitrogen atmosphere.

Subsequently, dehydrated methanol as a poor solvent is added dropwise to the synthesis solution C, causing soft flocculation and precipitation in the recovered synthesis solution C of semiconductor fine particles in which semiconductor crystals are formed of InP. The synthesis solution C is then subjected to centrifugal separation at 4,000 rpm for 10 minutes to recover the semiconductor fine particles from the synthesis solution C. The recovered semiconductor fine particles are again dissolved in dehydrated toluene used as a redispersion solvent, the semiconductor fine particles redissolved in the dehydrated toluene are softly flocculated with dehydrated methanol and precipitated, and centrifugal separation is performed at 4,000 rpm for 10 minutes to separate dehydrated toluene, thereby again recovering semiconductor fine particles containing InP. The above-described process using the dehydrated toluene and dehydrated methanol is repeated three times to purify the semiconductor fine particles, and the purified semiconductor fine particles are dissolved in dehydrated toluene to obtain a synthesis solution D. The synthesis solution D is in a state where unnecessary free matters from the surface modifier and synthesis by-products other than InP are removed, and accordingly semiconductor fine particles comprising InP (hereinafter, referred to as "InP nanoparticles") are synthesized.

JP 2009-40633 A describes a method for producing InP nanoparticles, in which InP nanoparticles are produced according to the following steps S1 to S12.

In Step S1, 1 g of TOPO and 8.5 g of TOP serving as organic solvents, and 0.5 g of hexadecylamine (HDA) are taken into a three-necked flask such that the hexadecylamine (HDA) concentration in the organic solvents becomes 5 wt %. As an In raw material, 1 g of indium chloride (InCl$_3$) is introduced therein (Step S2), and the mixture is stirred at 230° C. for 30 minutes to obtain a transparent solution (Step S3).

As a P raw material, 0.5 mg of tris(trimethylsilyl)phosphine is added in the heated transparent solution using a syringe (Step S4), and the transparent solution is immediately cooled to 210° C. and maintained for 10 minutes. By the above-described process, InP nanoparticles are synthesized (Step S5). Furthermore, after the solution is maintained for a predetermined period of time, a heating source is removed from the three-necked flask. These steps are carried out in a glovebox which is in an inert atmosphere with argon.

Next, 30 μL of the synthesized InP nanoparticles are taken into a sample tube, and 1 mL of hexane and 1 mL of butanol are added therein to obtain a transparent solution (Step S6). In addition, 50 μL of a hydrofluoric acid etching solution (a mixture solution of 5% hydrofluoric acid, 10% water and 85% 1-butanol) is added to the solution (Step S7), and the resulting solution is left to stand under a xenon lamp (500 W) for an hour, thereby subjecting the InP nanoparticles to a surface treatment (Step S8). These steps are carried out in the atmosphere.

Next, the sample subjected to the surface treatment is put in a round-bottomed flask, and heated on a hot plate set to a temperature of 130° C. with the pressure being reduced using a hydraulic rotary pump to remove the solvent (Step S9). After an hour elapsed, the round-bottomed flask is moved into the glovebox inside of which has been in an inert atmosphere with argon gas, and the argon gas is introduced into the flask. Hexane (dried solvent) and butanol (dried solvent) (1 mL each) are then added to obtain a solution in which the InP nanoparticles are dispersed (Step S10).

The resultant solution is put in a sample bottle, and the sample bottle is completely sealed to serve as a closed container (Step S11), in which argon gas is filled in a space where the solvent is not present. The sample bottle is irradiated with a xenon (Xe) lamp (500 W) at a light irradiation intensity of 0.3 W/cm$^2$ for an hour (Step S12).

JP 2008-279591 A describes a method for producing nanocrystals having a three-layer structure including a nanocrystal core made of InP, a buffer layer made of Se and a shell layer made of ZnS.

JP 2008-279591 A describes the method for producing nanocrystals having a three-layer structure as detailed below.

First, 0.07 mmol of indium acetate, 0.3 mmol of oleic acid, and 10 g of octadecene are mixed and stirred until reaching a temperature of 120° C. under vacuum. Tris(trimethylsilyl)phosphine (0.05 mmol) and octadecene (1 mL) are added at 250° C. to react for 20 minutes. Thereafter, 0.1 M trioctylphosphine selenide solution (0.02 mL) is added, the mixture is maintained as is for 30 minutes, and a solution containing zinc, oleic acid and octadecene is added such that the amount of zinc added is 0.2 mmol. The mixture is then stirred for an hour to cause reaction. Subsequently, the reaction temperature is raised to 300° C., and 1 mL of 0.4 M trioctylphosphine sulfide solution is added to react for an hour. The above-described nanocrystals having a three-layer structure are thereby produced.

JP 2010-106119 A describes a semiconductor nanoparticle phosphor having two or more emitting regions each of which exhibits a different quantum effect alone and one or more barrier regions in a laminated structure in which the two or more emitting regions are separated by the one or more barrier regions, and the two or more emitting regions share the same quantum level via the one or more barrier regions.

JP 2010-106119 A describes the method for producing the semiconductor nanoparticle phosphor having a core-shell structure of InP/InGaP/InP as detailed below.

First, an InP core (first emitting region) is formed as follows.

Using a commercial solvent distillation apparatus, a first solution is synthesized by reacting indium chloride dissolved in a trioctylphosphine (TOP) solvent and trioctylphosphine oxide (TOPO) in a heating tank, and the temperature of the first solution is raised to 285° C.

Subsequently, a second solution is prepared by dissolving tris(trimethylsilyl)phosphine in a TOP solvent, the second solution is introduced to the first solution in the heating tank through a syringe, and the temperature of the solution is maintained at 285° C. Through the steps of cooling, purifying and isolating, a colloidal solution containing InP core particles is recovered. The recovered colloidal solution is stirred in a hydrofluoric acid (HF) etching solution (at a HF:pure water:n-butanol weight ratio of 1:2:17), possible deactivating factors such as defects and foreign matters on the InP core particle surfaces are removed, and thereafter the colloidal solution is washed with an organic solvent.

Next, a first InGaP shell (barrier region) is formed as follows.

The colloidal solution containing the InP core particles is again put in a heating tank, a mixture solution of indium chloride and gallium chloride (molar ratio 1:1) is added thereto, and the temperature of the solution is raised to 285° C. The second solution is introduced in the heating tank via a syringe. After being kept at 285° C., the solution in the tank is cooled, purified and isolated to recover the colloidal solution in which the GaInP shell is formed over the surface of the InP core. The recovered colloidal solution is subjected to the above-described etching treatment and thereafter washed with an organic solvent.

Lastly, a second InP shell (second emitting region) is formed as follows.

The colloidal solution containing the InP core/GaInP shell particles is once again put in a heating tank and undergoes the same processes as when forming the InP cores except that the solution is kept at 300° C. Accordingly, the colloidal solution in which the InP shell is formed over the surface of the GaInP shell is recovered. The recovered colloidal solution is subjected to the above-described etching treatment and thereafter washed with an organic solvent. The above-described semiconductor nanoparticle phosphor is thereby obtained.

In the method for producing InP nanoparticles of JP 2010-138367 A, first, in a glovebox in an argon gas atmosphere, 0.4 g of indium chloride ($InCl_3$), 3 mL of trioctylphosphine (TOP, $[CH_3(CH_2)_7]_3P$) as a surfactant and 2.5 g of dodecylamine (DDA, $CH_3(CH_2)_{11}NH_2$) are put in an autoclave, and 5 mL of toluene ($C_6H_5CH_3$) as a solvent and 0.5 mL of tris(dimethylamino)phosphine, ($P[N(CH_3)_2]_3$) are further added.

Subsequently, the autoclave is brought into an electric furnace and kept at 75° C. for an hour, and is further heated to 180° C. to grow nanoparticles over 24 hours, thereby obtaining a nanoparticle dispersion. 10 mL of toluene and 6 mL of methanol are added to the nanoparticle dispersion, and the mixture is sufficiently stirred and then undergoes centrifugal separation for 10 minutes. Following the centrifugal separation, a clear supernatant liquid is taken out, thereby separating InP nanoparticles from by-products resulting from the reaction. Using the nanoparticle dispersion after removing the by-products, nanoparticles of different particle sizes are removed through a size-selective precipitation technique, and InP nanoparticles are obtained.

JP 2010-138367 A also discloses a method for producing semiconductor nanoparticles having a core-shell structure, in which a zinc sulfide shell is formed over an InP nanoparticle using ultraviolet irradiation.

SUMMARY OF THE INVENTION

As described above, various methods for synthesizing or producing InP nanoparticles have been proposed, but in many cases, surface energy of semiconductor fine particles is so high that the particles are likely to flocculate, and therefore the semiconductor fine particles often cannot express their original function. In addition, it is difficult to redisperse the semiconductor fine particles which have been flocculated during particle formation.

While JP 2006-265022 A, JP 2008-44827 A, WO 07/138, 851, JP 2009-19067 A, JP 2009-40633 A, JP 2008-279591 A, JP 2010-106119 A, and JP 2010-138367 A respectively disclose the methods for producing or synthesizing InP nanoparticles, these production or synthesis methods require setting a temperature as high as 170° C. to 350° C. when producing or synthesizing, and hence it is presumed that particles are flocculating during formation of InP nanoparticles. Even if it is attempted to disperse the thus obtained InP nanoparticles in toluene or hexane, the InP nanoparticles settle down due to a temporal change so that the InP particles has poor dispersibility. Accordingly, it is difficult to produce a uniform coating film of a photoelectric conversion material using InP nanoparticles.

In addition, photoluminescence (PL) intensity of the InP nanoparticles (semiconductor fine particles) obtained by the methods for producing (synthesizing) InP nanoparticles (semiconductor fine particles) disclosed by JP 2006-265022 A, JP 2008-44827 A, WO 07/138,851, JP 2009-19067 A, JP 2009-40633 A, JP 2008-279591 A, JP 2010-106119 A, and JP 2010-138367 A is insufficient.

The present invention aims at solving the problems lying in the prior art and has an object to provide a method for synthesizing InP nanoparticles which achieve both excellent solution dispersibility and high PL intensity, and the nanoparticles synthesized by the synthesis method.

In order to attain the above-described object, a first aspect of the invention provides a method for synthesizing indium phosphide nanoparticles using indium trichloride as an indium raw material and tris(dimethylamino)phosphine as a phosphorus raw material, comprising: a preparation step of mixing the indium raw material, the phosphorus raw material, an organic solvent having a boiling point of 170° C. or higher, and a particle surface ligand to obtain a mixture solution and a synthesis step of synthesizing the indium phosphide nanoparticles by heating the mixture solution to 150° C. or higher but lower than 170° C., wherein the particle surface ligand is an aliphatic amine having a carbon number of 18 or more, and wherein the indium trichloride is an anhydride.

Preferably, the method for synthesizing indium phosphide nanoparticles further comprises, subsequent to the synthesis step, a solution treatment step of treating surfaces of the indium phosphide nanoparticles using a solution containing hydrofluoric acid or buffered hydrofluoric acid, and subsequent to the solution treatment step, an irradiation step of irradiating the indium phosphide nanoparticles that have been surface treated with ultraviolet light for at least 10 minutes.

Preferably, the organic solvent is 1-octadecene.

Preferably, the particle surface ligand in the indium phosphide nanoparticles is a primary aliphatic amine having a carbon number of 18 or higher, and a heating and synthesizing time in the synthesis step is 30 minutes to 360 minutes.

A second aspect of the invention provides nanoparticles produced by the method for synthesizing indium phosphide nanoparticles according to the first aspect.

Moreover, a third aspect of the invention provides nanoparticles of a core-shell structure having cores formed of the indium phosphide nanoparticles produced by the method for synthesizing indium phosphide nanoparticles according to the first aspect and shells covering the cores.

According to the present invention, InP nanoparticles having both excellent solution dispersibility and high PL intensity can be synthesized at a lower temperature when synthesizing compared to a conventional method.

Further, the synthesized InP nanoparticles having high PL intensity can be utilized as a photoelectric conversion material for optical devices and thus can be applied to electroluminescence devices, photoelectric conversion devices (solar cells) and the like.

In addition, due to their excellent solution dispersibility, the synthesized InP nanoparticles can be used to produce a uniform coating film of a photoelectric conversion material and can also be used for coating-type electroluminescence devices and solar cells.

DETAILED DESCRIPTION OF THE INVENTION

The method for synthesizing InP nanoparticles and the nanoparticles according to the present invention are described below in detail based on a preferable embodiment.

A reaction container for synthesizing the InP nanoparticles according to the embodiment may be either a pressure-resistant reaction container (autoclave) like the one used in the solvothermal method or a glass flask like the one used in the hot-soap method. In such the container, a particle synthesis reaction takes place in an inert atmosphere at a high temperature (highest temperature of 150° C. or higher but lower than 170° C.).

Further, the InP particles are produced in an atmosphere from which moisture and oxygen are substantially excluded. In the production of the InP nanoparticles, the process from introducing the raw materials to be described later, an organic solvent and a particle surface ligand species into the container to be sealed until taking out the reaction product from the sealed container after the particle synthesis takes place in the atmosphere from which moisture and oxygen are substantially excluded.

In this embodiment, the atmosphere from which moisture and oxygen are substantially excluded may be a nitrogen atmosphere in which, for example, the oxygen concentration is less than 0.5 ppm and the moisture concentration is less than 1 ppm.

As long as an atmosphere from which moisture and oxygen are substantially excluded can be used, equipment or the like to be used to achieve such the atmosphere is not particularly limited.

In this embodiment, raw materials and an organic solvent are used to produce InP nanoparticles. The raw materials include an In compound and a P compound.

When producing the InP nanoparticles, a particle surface ligand species to be described later is further added to the raw materials and the organic solvent. The particle surface ligand species provides functions of particle surface protection (preventing oxidation and flocculation) and particle surface passivation (inactivating dangling bonds). Due to the particle surface ligand species, InP nanoparticles on whose surfaces particle surface ligands are formed are produced.

In the method for synthesizing InP nanoparticles according to this embodiment, a mixture liquid of an In compound, a P compound, an organic solvent and a particle surface ligand (particle surface ligand species) is prepared and then heated with stirring by using, for example, an autoclave with a belt-driven stirrer or a magnetic stirrer and a flask to synthesize InP nanoparticles. The autoclave or the tightly-sealed flask has inside thereof an inert atmosphere (nitrogen atmosphere or argon atmosphere) from which moisture and oxygen are substantially excluded, and synthesis of InP nanoparticles takes place in the inert atmosphere from which moisture and oxygen are substantially excluded.

The autoclave and the flask are preferably sealed in an inert atmosphere and heated in the tightly-sealed state, but may be heated while introducing an inert gas.

However, a glass flask in a tightly-sealed state should not be heated to exceed the boiling point of the organic solvent.

The InP nanoparticles are synthesized under the condition of a temperature of 150° C. or higher and lower than 170° C. The heating and synthesizing time during which heating is carried out at a temperature of 150° C. or higher and lower than 170° C. is preferably 30 minutes to 360 minutes. The heating and synthesizing time refers to a period of time for which the temperature is maintained after it is elevated to 150° C. or higher but lower than 170° C.

The reaction product as a result of the synthesis is taken out from the autoclave and is repeatedly subjected to centrifugal separation by, for example, using a centrifuge with a good solvent such as toluene or octane and a poor solvent such as dehydrated ethanol to wash the product, thereby discarding unreacted materials and by-products and extracting InP nanoparticles which are then dispersed in a dispersion solvent such as octane.

Thereafter, the octane solution containing the nanoparticles is subjected to distillation under reduced pressure using, for example, a rotary evaporator to thoroughly remove ethanol. An octane dispersion liquid containing the synthesized InP nanoparticles is thereby obtained. The InP nanoparticles can be thereby produced.

In the present invention, before finally dispersing the InP nanoparticles in the dispersion solvent, a solution containing hydrofluoric acid or buffered hydrofluoric acid is preferably added to perform a surface treatment on the InP nanoparticles. The surface treatment of the InP nanoparticles presumably removes dangling bonds on the InP nanoparticle surfaces. For example, Appl. Phys. Lett. 68(96) 3150 and J. Chem. Phys. 123, 084706 (2005) describe that dangling bonds on InP nanoparticle surfaces are removed by the surface treatment of InP nanoparticles. App. Phys. Lett. 68(96) 3150 or others can be referred to for the amount of the solution containing hydrofluoric acid or buffered hydrofluoric acid to be added and for the treatment time.

The InP nanoparticles according to the present invention have the improved PL intensity due to the particle surface treatment with the above-described hydrofluoric acid or buffered hydrofluoric acid.

Moreover, in the present invention, after being finally dispersed in the dispersion solvent, the InP nanoparticles are preferably irradiated with ultraviolet light (UV light) by using a ultraviolet light lamp (UV lamp) having a wavelength of 365 nm, for example. More specifically, the octane dispersion in which InP nanoparticles are dispersed is preferably irradiated with ultraviolet light (UV light). The irradiation time of ultraviolet light is 10 minutes or longer, preferably 30 minutes or longer, and more preferably 60 minutes or longer. The InP nanoparticles according to the present invention have the improved PL intensity as a result of the ultraviolet light irradiation.

The InP nanoparticles have an average particle size of preferably 1 nm to 10 nm, and more preferably 3 nm to 10 nm.

The above-described average particle size is determined by a direct observation with a transmission electron microscope, a dynamic scattering method, a half-value width of an X-ray diffraction peak (Debye-Scherrer's equation) or others. Meanwhile, the average particle size of InP nanoparticles is preferably determined by directly observing at least 20 particles, preferably at least 100 particles with a transmission electron microscope and calculating an arithmetic mean thereof.

Indium trichloride is used as an In compound material (In source). The Indium trichloride is anhydride. Hereinafter, the indium trichloride which is an anhydride is expressed as indium trichloride (anhydride).

Tris(dimethylamino)phosphine is used as a P compound material (P source).

A non-polar solvent having a boiling point of 170° C. or higher is used as an organic solvent. The non-polar solvent is exemplified by saturated aliphatic hydrocarbons such as n-decane, n-dodecane, n-hexadecane and n-octadecane; unsaturated aliphatic hydrocarbons such as 1-undecene, 1-dodecene, 1-hexadecene and 1-octadecene; and trioctylphosphine. Among these, an unsaturated aliphatic hydrocarbon having a carbon number of 12 or more is preferable, and 1-octadecene is more preferable.

By using an organic solvent having a boiling point of 170° C. or higher, particles are not likely to flocculate during particle formation, resulting in the better dispersibility of InP nanoparticles in the solution.

An aliphatic amine having a carbon number of 18 or more is used as a particle surface ligand species (surfactant) for forming surface ligands on the InP nanoparticles. While a carbon chain may have a saturated bond or an unsaturated bond and may be a straight chain or a branched chain, it is preferable to have a long carbon-chain, and a long-chain aliphatic amine is preferably used. A primary aliphatic amine having a carbon number of 18 or more is particularly preferably used.

Examples of the primary aliphatic amine having a carbon number of 18 or more include $C_{18}H_{37}NH_2$, $C_{19}H_{39}NH_2$, $C_{20}H_{41}NH_2$, $C_{21}H_{43}NH_2$, $C_{22}H_{45}NH_2$, $C_{18}H_{39}NH_2$, $C_{19}H_{41}NH_2$, $C_{20}H_{43}NH_2$, $C_{21}H_{45}NH_2$, and $C_{22}H_{47}NH_2$.

In the embodiment, the particle surface ligand species described above is coordinated on the InP nanoparticle surface.

If the particle surface ligand species is replaced with dodecylamine, tetradecylamine, hexadecylamine, oleylamine, trioctylamine or eicocylamine, the PL intensity becomes higher. In particular, it has been verified that if the particle surface ligand species having a carbon number of 16 or less is replaced with one having a carbon number of 18, the PL intensity becomes significantly high.

In the embodiment, the InP nanoparticles are described, but the present invention is not limited thereto. The present invention includes nanoparticles having a core-shell structure in which the core comprises an InP nanoparticle. In such the case, the shell is formed of ZnS, ZnO, InGaZnO or the like, and is preferably formed of ZnS.

Moreover, also in the nanoparticles having the core-shell structure, nanoparticle surface ligands formed of an aliphatic amine having a carbon number of 18 or more, or a primary aliphatic amine having a carbon number of 18 or more may be present, similarly to the above-described InP nanoparticles.

The above-described nanoparticles having the core-shell structure also have an average particle size of preferably 1 nm to 10 nm and more preferably 3 nm to 10 nm. The average particle size can be also determined by the same method as what is used for the InP nanoparticles described above. Thus, the detailed description thereof is omitted. Similarly to the case of InP nanoparticles described above, the average particle size of the nanoparticles having the core-shell structure is preferably determined by directly observing at least 20 particles, preferably at least 100 particles with a transmission electron microscope and calculating an arithmetic mean thereof.

Next, an exemplary example of method for synthesizing the nanoparticles having the core-shell structure is described.

The method for synthesizing the nanoparticles having the core-shell structure takes the same steps as the above-described method for synthesizing the InP nanoparticles until stirring the mixture solution of raw materials, an organic solvent and a particle surface ligand (particle surface ligand species). Therefore, a detailed description thereof is omitted.

Subsequent to stirring of the mixture solution, the autoclave or flask is sufficiently cooled. Then, the autoclave or flask is opened inside the glovebox in an inert gas atmosphere, anhydrous zinc acetate and 1-dodecanethiol, for example, are further added and mixed therein. The autoclave or flask is then sealed and taken out from the glovebox. Thereafter, the autoclave or flask is kept at a given temperature for a given period of time, for example, at 180° C. for an hour, to obtain the reaction product.

The reaction product is taken out from the autoclave or flask, and, similarly to the method for synthesizing the InP nanoparticles, is repeatedly subjected to centrifugal separation by, for example, using a centrifuge with a good solvent such as toluene or octane and a poor solvent such as dehydrated ethanol to wash the product, thereby discarding unreacted materials and by-products and extracting InP nanoparticles which are then dispersed in a dispersion solvent such as octane.

Thereafter, the octane solution containing the nanoparticles is subjected to distillation under reduced pressure using, for example, a rotary evaporator to thoroughly remove ethanol. An octane dispersion containing the synthesized nanoparticles having the core-shell structure is thereby obtained. The nanoparticles having the core-shell structure can be thereby produced.

The InP nanoparticles and the nanoparticles having the core-shell structure according to this embodiment achieve both excellent solution dispersibility and high PL intensity and can be used as photoelectric conversion materials for optical devices. Since the InP nanoparticles and the nanoparticles having the core-shell structure have excellent solution dispersibility, an even coating film of a photoelectric conversion material can be made by using the InP nanoparticles or the nanoparticles having the core-shell structure. In addition, the InP nanoparticles and the nanoparticles having the core-shell structure are high-quality crystals having high PL intensity and can be applied to a coating-type electroluminescence device and a solar cell. Accordingly, the InP nanoparticles and the nanoparticles having the core-shell structure both can be used for an emitting layer in an electroluminescence device, a light absorbing layer (photoelectric conversion layer) in a solar cell and so forth. Therefore, such an electroluminescence device can have an improved luminescence intensity, while such a solar cell can have an improved conversion efficiency.

The electroluminescence device can be formed by superposing, on a substrate, a transparent electrode, a hole transport layer, an emitting layer, an electron transport layer, and a rear surface electrode in this order as disclosed by JP 2003-257671 A, for example. In this structure, because of the excellent solution dispersibility, all the layers constituting the electroluminescence device can be formed by the coating method (wet method) so that a device having a large area can be preferably produced at a high speed but at a low cost.

The solar cell can be formed by superposing, on a substrate, a transparent electrode, a positive electrode interfacial layer (for assuring smoothness), a light absorbing layer and a rear surface electrode in this order as disclosed by APPLIED PHYSICS LETTERS 92, 173307 (2008) and JP 2009-59796 A, for example. Also in this structure, similarly to the electroluminescence device, all the layers constituting the solar cell can be formed by the coating method (wet method) so that a solar cell having a large area can be preferably produced at a high speed but at a low cost.

The present invention is basically constituted as described above. The method for synthesizing the InP nanoparticles and the nanoparticles according to the present invention have been described above in detail, but the present invention is not limited to the above-described embodiment and can be modified or changed in various ways without departing from the gist of the invention.

EXAMPLES

The method for synthesizing the InP nanoparticles according to the present invention is described below in further detail.

In EXAMPLES, nanoparticles of Samples 1 to 22 shown in Table 1 below were synthesized by the synthesis methods respectively described later and were evaluated for solution dispersibility and PL intensity.

The method for synthesizing the InP nanoparticles of Sample 1 is now described.

In Sample 1, the InP nanoparticles were synthesized by the following method using an autoclave with a belt-driven stirrer manufactured by AKICO Corporation.

First, a nitrogen atmosphere (oxygen concentration of less than 0.5 ppm and moisture concentration of less than 1 ppm) was achieved inside the autoclave. In the nitrogen atmosphere, 50 mL of 1-octadecene as an organic solvent, 2.7 mmol of indium trichloride (anhydride) as an In compound, 2.7 mmol of tris(dimethylamino)phosphine as a P compound and 5.4 mmol of oleylamine as a particle surface ligand species were put in the autoclave and mixed to obtain a mixture solution. The autoclave was then sealed.

Next, the mixture solution in the autoclave was heated by an autoclave heating wire while being stirred by the stirrer.

The mixture solution at room temperature was heated to 140° C. (maximum heating temperature) by the autoclave heating wire, maintained as is for 180 minutes and thereafter cooled. The time for which the mixture solution was thus heated and maintained (heating and synthesizing time) is shown in Table 1 below as "maintaining time."

The reaction product was taken out from the autoclave which was sufficiently cooled and was repeatedly subjected to centrifugal separation by using a centrifuge with a good solvent such as toluene or octane and a poor solvent such as dehydrated ethanol to wash the product, thereby discarding unreacted materials and by-products and extracting the InP nanoparticles.

Before extracting the nanoparticles as the last step, 0.1 mL of a buffered hydrofluoric acid solution (HF 22 vol %) was added to the precipitates containing the nanoparticles to perform a surface treatment on the nanoparticles for one minute. The nanoparticles subjected to the surface treatment with the buffered hydrofluoric acid is shown in Table 1 below as "Treated" in the column of "Treatment with Buffered Hydrofluoric Acid Solution," while the nanoparticles not subjected to the surface treatment with the buffered hydrofluoric acid are shown as "Not treated."

Octane was added to the precipitates containing the synthesized and lastly extracted nanoparticles, which were then subjected to ultrasonic dispersion and further subjected to distillation under reduced pressure by using a rotary evaporator to remove the remaining ethanol, thereby obtaining an octane dispersion containing the synthesized nanoparticles.

In addition, the octane dispersion containing the thus synthesized nanoparticles is irradiated with ultraviolet (UV) light having a wavelength of 365 nm emitted from a UV lamp (6 W) for 60 minutes. The nanoparticles irradiated with ultraviolet (UV) light in this manner is shown in Table 1 below as "Irradiated" in the column of "UV Light Irradiation," while the nanoparticles not irradiated with UV light are shown as "Not irradiated."

The octane dispersion containing the synthesized nanoparticles was diluted, dropped onto a carbon mesh and dried. Thereafter, it was observed with a high-resolution transmission electron microscope (HR-TEM) and as result the average particle size of the obtained nanoparticles was 5 nm.

Moreover, particle powder obtained by drying the octane dispersion containing the synthesized nanoparticles was analyzed for X-ray diffraction and as a result a peak corresponding to InP was detected.

In EXAMPLES, the solution dispersibility was evaluated by leaving the octane dispersion containing the synthesized nanoparticles stand while not being stirred and determining how many days to take for nanoparticles to spontaneously settle. The evaluation criteria are set such that "D" is given for the case where the elapsed time was less than one day for nanoparticles to settle so as to be separated from the supernatant, "C" for the case where the elapsed time was longer than one day but not longer than 7 days, "B" for the case where the elapsed time was longer than 7 days but not longer than 30 days, and "A" for the case where the elapsed time was longer than 30 days.

Moreover, the half-value width of the photoluminescence (PL) intensity was determined by measuring a fluorescence spectrum of the octane dispersion containing the synthesized nanoparticles at room temperature using light having an excitation wavelength of 400 nm.

Next, the methods for synthesizing the InP nanoparticles of Samples 2 to 21 are described.

The InP nanoparticles of Samples 2 to 21 were produced by the same synthesis method as of Sample 1 described above, except that the maximum heating temperature during synthesizing the particles, the maintaining time (heating and synthesizing time), the organic solvent type, the particle surface ligand species, presence of the treatment with buffered hydrofluoric acid and presence of UV light irradiation were changed to what Table 1 shows. Therefore, the detailed description of the synthesis methods of Samples 2 to 21 is omitted.

In addition, since the solution dispersibility and the PL intensity of the respective samples in Samples 2 to 21 were evaluated similarly to Sample 1, the detailed description thereof is also omitted.

Next, the method for synthesizing the InP/ZnS core-shell particles in Sample 22 is described.

A nitrogen atmosphere (oxygen concentration of less than 0.5 ppm and moisture concentration of less than 1 ppm) was achieved inside an autoclave, and 50 mL of 1-octadecene as an organic solvent, 2.7 mmol of indium trichloride (anhydride) as an In compound, 2.7 mmol of tris(dimethylamino) phosphine as a P compound and 5.4 mmol of oleylamine as a particle surface ligand species were put in the autoclave and mixed to obtain a mixture solution. The autoclave was then sealed.

Next, the mixture solution in the autoclave was heated by an autoclave heating wire while being stirred by the stirrer.

The mixture solution at room temperature was heated to 160° C. (maximum heating temperature) by the autoclave heating wire, maintained as is for 180 minutes and thereafter cooled.

Subsequently, the sufficiently-cooled autoclave was opened, 4.6 mmol of anhydrous zinc acetate and 4.6 mmol of 1-dodecanethiol were further added to the mixture solution in the autoclave and mixed therein to obtain a second mixture solution, and the autoclave was then closed. The second mixture solution was heated at 180° C. for 60 minutes, and the reaction product was obtained. Thereafter, like in the synthesis method of the InP nanoparticles in Sample 1, the nanoparticles were extracted and dispersed as described above to obtain the InP/ZnS core-shell particles of Sample 22.

The InP/ZnS core-shell particles of Sample 22 were observed with a high-resolution transmission electron microscope (HR-TEM) and as a result the average particle size of the obtained InP/ZnS core-shell particles of Sample 22 was 6 nm.

Since the solution dispersibility and PL intensity of Sample 22 were evaluated similarly to Sample 1, the detailed description thereof is omitted.

a tertiary aliphatic amine, and is higher when the particle surface ligand species is a primary aliphatic amine than when it is a secondary aliphatic amine. In Samples 7 to 9, the solution dispersibility is better if using a primary aliphatic amine.

Samples 3 and 10 to 12 in which the same maximum heating temperature, maintaining time and particle surface ligand species were adopted exhibit the better solution dispersibility if the organic solvent has a boiling point exceeding 300° C.

TABLE 1

| Sample | Maximum heating temperature (° C.) | Maintaining Time (min.) | Organic Solvent | Particle Surface Ligand Species | Treatment with Buffered Hydrofluoric Acid Solution | UV Light Irradiation | Core-shell Structure | Solution Dispersibility | PL Intensity (half-value width nm) |
|---|---|---|---|---|---|---|---|---|---|
| 1 | 140 | 180 | 1-Octadecene (boiling point 315° C.) | Oleylamine ($C_{18}H_{35}NH_2$) | Treated | Irradiated | NO | A | 91 |
| 2 | 150 | 180 | 1-Octadecene (boiling point 315° C.) | Oleylamine ($C_{18}H_{35}NH_2$) | Treated | Irradiated | NO | A | 47 |
| 3 | 160 | 180 | 1-Octadecene (boiling point 315° C.) | Oleylamine ($C_{18}H_{35}NH_2$) | Treated | Irradiated | NO | A | 43 |
| 4 | 170 | 180 | 1-Octadecene (boiling point 315° C.) | Oleylamine ($C_{18}H_{35}NH_2$) | Treated | Irradiated | NO | C | 42 |
| 5 | 160 | 180 | 1-Octadecene (boiling point 315° C.) | Tetradecylamine ($C_{14}H_{29}NH_2$) | Treated | Irradiated | NO | D | 68 |
| 6 | 160 | 180 | 1-Octadecene (boiling point 315° C.) | Hexadecylamine ($C_{16}H_{33}NH_2$) | Treated | Irradiated | NO | D | 62 |
| 7 | 160 | 180 | 1-Octadecene (boiling point 315° C.) | Octadecylamine ($C_{18}H_{37}NH_2$) | Treated | Irradiated | NO | A | 45 |
| 8 | 160 | 180 | 1-Octadecene (boiling point 315° C.) | Dinonylamine (($C_9H_{19}$)$_2$NH) | Treated | Irradiated | NO | B | 47 |
| 9 | 160 | 180 | 1-Octadecene (boiling point 315° C.) | Trihexylamine (($C_6H_{13}$)$_3$N) | Treated | Irradiated | NO | B | 46 |
| 10 | 160 | 180 | 1-Hexadecene (boiling point 287° C.) | Oleylamine ($C_{18}H_{35}NH_2$) | Treated | Irradiated | NO | B | 44 |
| 11 | 160 | 180 | 1-Dodecene (boiling point 214° C.) | Oleylamine ($C_{18}H_{35}NH_2$) | Treated | Irradiated | NO | B | 44 |
| 12 | 160 | 180 | 1-Undecene (boiling point 192° C.) | Oleylamine ($C_{18}H_{35}NH_2$) | Treated | Irradiated | NO | B | 43 |
| 13 | 160 | 180 | 1-Decene (boiling point 169° C.) | Oleylamine ($C_{18}H_{35}NH_2$) | Treated | Irradiated | NO | C | 43 |
| 14 | 160 | 180 | Xylene (boiling point about 140° C.) | Oleylamine ($C_{18}H_{35}NH_2$) | Treated | Irradiated | NO | D | 42 |
| 15 | 160 | 20 | 1-Octadecene (boiling point 315° C.) | Oleylamine ($C_{18}H_{35}NH_2$) | Treated | Irradiated | NO | A | 45 |
| 16 | 160 | 30 | 1-Octadecene (boiling point 315° C.) | Oleylamine ($C_{18}H_{35}NH_2$) | Treated | Irradiated | NO | A | 46 |
| 17 | 160 | 100 | 1-Octadecene (boiling point 315° C.) | Oleylamine ($C_{18}H_{35}NH_2$) | Treated | Irradiated | NO | A | 44 |
| 18 | 160 | 360 | 1-Octadecene (boiling point 315° C.) | Oleylamine ($C_{18}H_{35}NH_2$) | Treated | Irradiated | NO | A | 49 |
| 19 | 160 | 370 | 1-Octadecene (boiling point 315° C.) | Oleylamine ($C_{18}H_{35}NH_2$) | Treated | Irradiated | NO | B | 39 |
| 20 | 160 | 180 | 1-Octadecene (boiling point 315° C.) | Oleylamine ($C_{18}H_{35}NH_2$) | Treated | Not irradiated | NO | A | 53 |
| 21 | 160 | 180 | 1-Octadecene (boiling point 315° C.) | Oleylamine ($C_{18}H_{35}NH_2$) | Not treated | Not irradiated | NO | A | 62 |
| 22 | 160 | 180 | 1-Octadecene (boiling point 315° C.) | Oleylamine ($C_{18}H_{35}NH_2$) | Not treated | Not irradiated | YES (ZnS shell) | A | 39 |

As shown in Table 1 above, Samples 2, 3, 7 to 12 and 15 to 22 which fall within the scope of the present invention exhibited excellent solution dispersibility and, in addition, high PL intensities.

Samples 2 and 3 in which the same maintaining time, organic solvent and particle surface ligand species were adopted tend to have higher PL intensities with the higher maximum heating temperature.

In Samples 7 to 9 in which the same maximum heating temperature, maintaining time and organic solvent were adopted, PL intensity is higher when the particle surface ligand species is a secondary aliphatic amine than when it is Samples 15 to 19 in which the same maximum heating temperature, organic solvent and particle surface ligand species were adopted exhibit the better solution dispersibility if the maintaining time falls within a preferable range.

Samples 3, 20 and 21 in which the same maximum heating temperature and maintaining time were adopted tend to have the higher PL intensities because of the treatment with buffered hydrofluoric acid and UV light irradiation. Sample 21 was not irradiated with UV light and thus has the lower PL intensity than Sample 3. Sample 21 in which the treatment with buffered hydrofluoric acid and UV light irradiation were not performed exhibits the lower PL intensity than Sample 20.

Moreover, by adopting the core-shell structure as in Sample 22, Sample 22 exhibited the highest PL intensity among Samples 1 to 22.

In the meantime, Sample 1 in which the maximum heating time is lower than the lower limit of the present invention did not exhibit sufficient PL intensity. Sample 4 in which the maximum heating temperature exceeds the upper limit of the present invention had poor solution dispersibility.

Samples 5 and 6 in which the particle surface ligand species were not aliphatic amines having a carbon number of 18 or more had poor solution dispersibility. Samples 13 and 14 in which the organic solvents each had a lower boiling point than the lower limit of the present invention had poor solution dispersibility.

What is claimed is:

1. A method for synthesizing indium phosphide nanoparticles using indium trichloride as an indium raw material and tris(dimethylamino)phosphine as a phosphorus raw material, comprising:
    a preparation step of mixing the indium raw material, the phosphorus raw material, an organic solvent having a boiling point of 170° C. or higher, and a particle surface ligand to obtain a mixture solution and
    a synthesis step of synthesizing the indium phosphide nanoparticles by heating the mixture solution to 150° C. or higher but lower than 170° C.,
    wherein the particle surface ligand is an aliphatic amine having a carbon number of 18 or more, and
    wherein the indium trichloride is an anhydride.

2. The method for synthesizing indium phosphide nanoparticles according to claim 1, further comprising, subsequent to the synthesis step,
    a solution treatment step of treating surfaces of the indium phosphide nanoparticles using a solution containing hydrofluoric acid or buffered hydrofluoric acid.

3. The method for synthesizing indium phosphide nanoparticles according to claim 1, further comprising, subsequent to the synthesis step,
    a solution treatment step of treating surfaces of the indium phosphide nanoparticles using a solution containing hydrofluoric acid or buffered hydrofluoric acid, and
    an irradiation step of irradiating the indium phosphide nanoparticles that have been surface treated with ultraviolet light for at least 10 minutes.

4. The method for synthesizing indium phosphide nanoparticles according to claim 1, wherein the organic solvent is 1-octadecene.

5. The method for synthesizing indium phosphide nanoparticles according to claim 1, wherein the particle surface ligand in the indium phosphide nanoparticles is a primary aliphatic amine having a carbon number of 18 or higher.

6. The method for synthesizing indium phosphide nanoparticles according to claim 1, wherein a heating and synthesizing time in the synthesis step is 30 minutes to 360 minutes.

* * * * *